(12) United States Patent
Athavale et al.

(10) Patent No.: US 6,346,428 B1
(45) Date of Patent: *Feb. 12, 2002

(54) METHOD AND APPARATUS FOR MINIMIZING SEMICONDUCTOR WAFER ARCING DURING SEMICONDUCTOR WAFER PROCESSING

(75) Inventors: Satish D. Athavale, Fishkill, NY (US); Leslie G. Jerde, Novato; John A. Meyer, Rohnert Park, both of CA (US)

(73) Assignee: Tegal Corporation, Petaluma, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/135,210

(22) Filed: Aug. 17, 1998

(51) Int. Cl.$^7$ ................................................ H01L 21/66
(52) U.S. Cl. ............................ 438/14; 438/17; 361/234
(58) Field of Search ..................... 438/14, 17; 361/234

(56) References Cited

U.S. PATENT DOCUMENTS

| | | | | |
|---|---|---|---|---|
| 4,889,588 A | * | 12/1989 | Fior | 156/643 |
| 5,737,177 A | * | 4/1998 | Mett et al. | 361/234 |
| 5,800,878 A | * | 9/1998 | Yao | 427/573 |
| 5,812,361 A | * | 9/1998 | Jones et al. | 361/234 |
| 5,835,335 A | * | 11/1998 | Ross et al. | 361/234 |
| 5,894,400 A | * | 4/1999 | Graven et al. | 361/234 |
| 5,933,314 A | * | 8/1999 | Lambson et al. | 361/234 |

OTHER PUBLICATIONS

*Electrostatic chucks in wafer processing*, Peter Singer, Semiconductor International, Apr. 1995, pp. 57–64.
*Manufacturing issues of electrostatic chucks*, D. R. Wright, et al., J.Vac.Sci. Technol. B 13(4), Jul./Aug. 1995, ©1995 American Vacuum Society, pp. 1910–1916.
Daviet et al., *J. Electrochem Soc. 140 (11)*, pp. 3245–3256 (1993).
Daviet et al., *J. Electrochem Soc. 140 (11)*, pp. 3256–3261 (1993).

* cited by examiner

*Primary Examiner*—John F. Niebling
*Assistant Examiner*—Olivia T Luk
(74) *Attorney, Agent, or Firm*—Fliesler Dubb Meyer & Lovejoy LLP

(57) ABSTRACT

A method and apparatus for minimizing or eliminating arcing or dielectric breakdown across a wafer during a semiconductor wafer processing step includes controlling the voltage across the wafer so that arcing and/or dielectric breakdown does not occur. Using an electrostatic clamp of the invention and by controlling the specific clamp voltage to within a suitable range of values, the voltage across a wafer is kept below a threshold and thus, arcing and/or dielectric breakdown is reduced or eliminated.

26 Claims, 3 Drawing Sheets

METHOD AND APPARATUS FOR MINIMIZING SEMICONDUCTOR WAFER ARCING DURING SEMICONDUCTOR WAFER PROCESSING

FIELD OF THE INVENTION

The present invention is directed to a method and apparatus for processing semiconductor wafers.

BACKGROUND OF THE INVENTION

A phenomenon which can reduce the yield of useful die from wafers during a semiconductor wafer processing step is the occurrence of arcing, also known as microarcing. Generally, during wafer processing, arcing can occur across the semiconductor wafer and in particular can be concentrated at material defects such as a crack, or at prominent feature of the wafer, which has been processed into the wafer, such as for example pillars. When such arcing occurs, part or all of the wafer can be irreparably damaged.

SUMMARY OF THE INVENTION

The present invention is directed to minimizing or eliminating arcing across a semiconductor wafer during a semiconductor wafer processing.

The invention describes a methodology and apparatus used to eliminate and/or substantially decrease the arcing or dielectric breakdown which may occur on a semiconductor wafer or substrate. The invention includes using a chuck and preferably an electrostatic chuck to control the electrostatic clamp voltage applied to the wafer to within a suitable range of values, such that arcing or dielectric breakdown is substantially reduced or eliminated. Such controlling can occur dynamically as process values change during the process steps. Further, by way of example only, such invention is of particular value with wafers containing film having a high dielectric constant or wafers containing films of ferroelectric material. However, such invention is useful for etching all types of standard and conventional films where arcing can also be a problem.

In particular, the apparatus and method are particularly useful for reducing or eliminating arcing or dielectric breakdown during etching in a plasma reactor.

Further, the invention includes a reactor for processing a semiconductor wafer which includes a reactor chamber and a chuck, and preferably an electrostatic chuck, which can accept a wafer for processing. The reactor includes a power supply associated with the reactor chamber, which power supply is capable of generating a first voltage at the surface of the wafer adjacent to the plasma during the processing of the wafer. The invention further includes a control mechanism that can control a second voltage that the electrostatic chuck applies to the wafer in order to hold the wafer to the chuck during wafer processing. The control mechanism is capable of adjusting the second voltage so that the difference between the first voltage and the second voltage or, in other words, the potential across the wafer, is kept below a threshold in order to minimize arcing across the wafer. Such adjustments can be made dynamically, if desired throughout the wafer fabrication process.

Accordingly, one aspect of the invention includes apparatus that controls the voltage applied to the surface of a wafer in contact with an electrostatic chuck in order to minimize the difference between the applied clamping voltage and the voltage built up on the other side of the wafer which is in contact with, for example, a plasma generated in an etch reactor.

A method of the invention includes the steps of placing a semiconductor wafer into a reactor and onto an electrostatic chuck, and generating a plasma in the reactor. The method further includes controlling the voltage across the wafer in order to minimize arcing.

In an aspect of the invention, the controlling step includes controlling the difference between the voltage at the first surface of the wafer in contact with the plasma, and the voltage at a second surface of the wafer in contact with the chuck.

In another aspect of the present invention, the plasma is generated by at least one of a high frequency power supply and a low frequency power supply.

In a further aspect of the present invention, both the high frequency power supply and a low frequency power supply are applied to the chuck.

In a further aspect of the present invention, the method includes applying a semiconductor processing step to one of high dielectric constant film on a substrate and a ferroelectric film on a substrate.

Accordingly, it can be seen that the present invention is effective in reducing or eliminating arcing across a wafer and in particular a wafer which has a high dielectric constant film and/or ferroelectric film. Such invention is advantageous in that it increases the yield of die.

DETAILED DESCRIPTION OF THE PREFERRED EMBODIMENT

Figure 1:
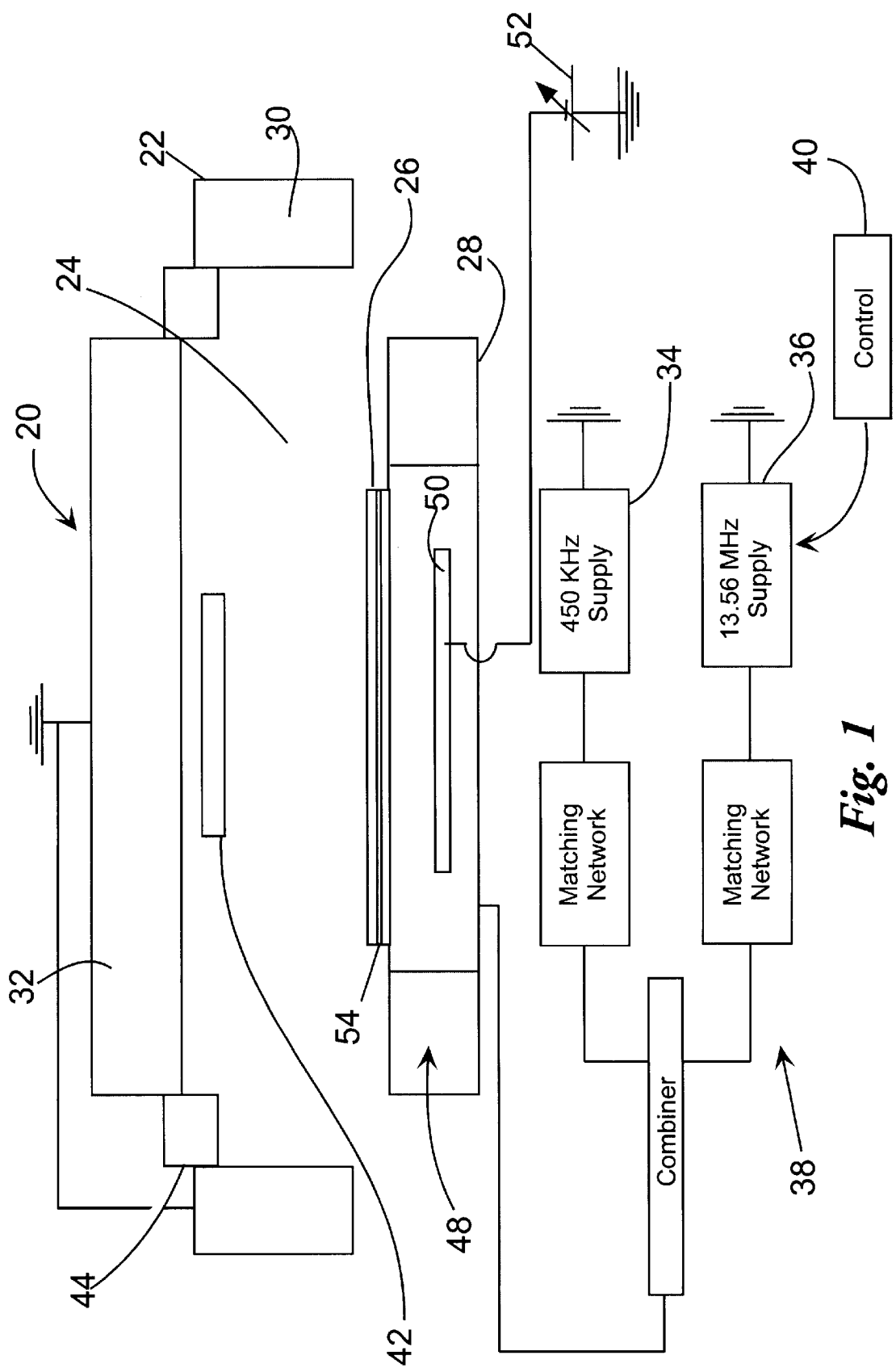
FIG. 1 is a schematical representation of an embodiment of a reactor of the invention which can be used to carry out a method of the invention.
Figure 2:
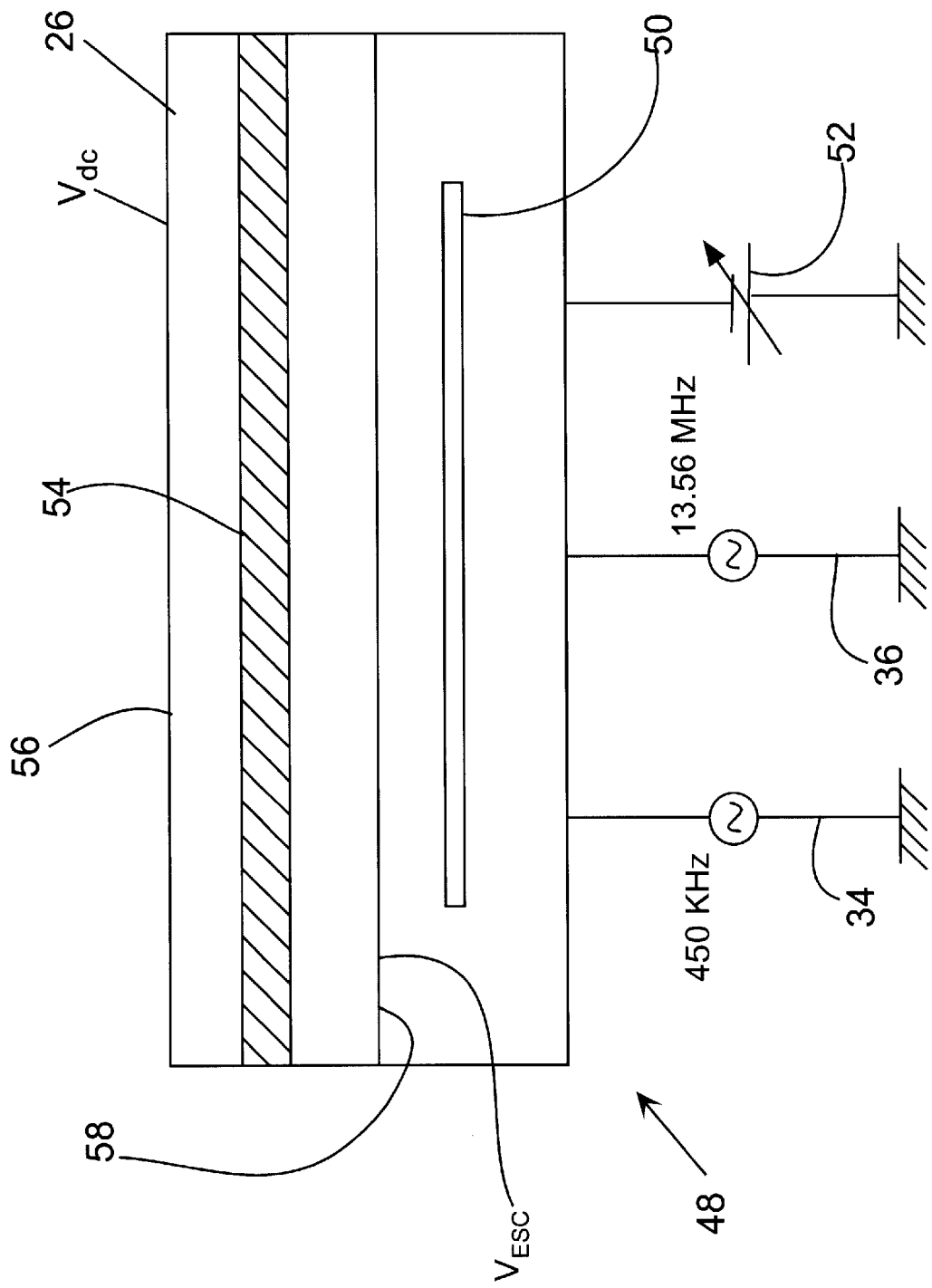
FIG. 2 depicts an enlargement of the wafer positioned on an embodiment of the electrostatic chuck of the invention of FIG. 1.

The method of the present invention can be performed in an etch reactor, such as the etch reactor of the invention depicted in FIG. 1, using the chuck configuration, such as the electrostatic chuck configuration shown in FIG. 2. As is known in the art, electrostatic chucks apply an electrostatic force in order to clamp a wafer onto said chucks. It is to be understood that other reactors including, but not limited to other etch reactors, and other chuck configurations can be used and be within the scope and spirit of the invention. By way of example only, mechanical clamping chucks which have been modified to apply a potential to a wafer are within the spirit and scope of the invention.

The etch reactor of FIG. 1 is identified by the number 20 and is configurated as a tri-electrode reactor. The etching apparatus 20 includes a housing 22 and an etching chamber 24. A wafer 26 is positioned on a bottom electrode 28. The chamber 24 further includes a side peripheral electrode 30 and an upper electrode 32. In a preferred embodiment, the side peripheral electrode 30 can be grounded or allowed to establish a floating potential as a result of the plasma developed in the chamber 24. The upper electrode 32 is generally grounded. In typical operation, both the side peripheral electrode 30 and the upper electrode 32 are grounded as shown in FIG. 1.

Preferably two A.C. power supplies, first power supply 34 and second power supply 36, are connected to the bottom electrode 28 through a appropriate circuitry 38 which includes matching networks and a combiner. Further a controller 40 controls the sequencing of the first and second AC power supplies 34, 36. Typically, the first power supply 34 operated in the kilohertz range and is optimally provided at about 450 KHz, and typically in the range of less than 500 KHz. The second power supply 36 operates in the megahertz range, and typically operates at about 13.56 MHz, although other frequencies above about 1 MHz and also multiples of 13.56 MHz can be used with the present invention. The power supply 34 is preferably powered at 200 watts and the second power supply 36 is preferably powered at 500 watts for this example. The low frequency KHz power supply can cycle up to about 500 watts if desired, and the high frequency MHz power supply can cycle up to about 1150 watts if desired during an etch process. Ion energy increases towards the kilohertz range while ion density increases towards the megahertz range. Additionally, reactor 20 includes gas inlet head 42 and a gas outlet port 44.

The chuck 48 which is incorporated in the bottom electrode 28 is an electrostatic chuck. Electrostatic chucks are well known in the industry. This electrostatic chuck include an electrostatic clamp electrode 50, to which is preferably applied a DC voltage from voltage source 52. Controller 40, in this preferred embodiment, can dynamically (overtime accordingly to changing process conditions such as changing power input to the electrodes) control the voltage applied to the electrostatic clamp electrode 50 by the source 52. Such control depends on, for example, the ramping and cycling fo one or more of the other power supplier.

In this particular embodiment, the wafer 26 includes a film 54 which is comprised of one of a high dielectric constant material or a ferroelectric material. It is to be understood, however, that the invention can work successfully on any film and in any situation where arcing can be a problem.

It is to be understood that the above inventive structure can be modified such that one or more of the power supplies can be applied to electrodes 30 and/or 32 in addition to being applied to electrode 28 if desired. Further, it is to be understood that the invention can include only a single power supply applied to the lower electrode 28. It is also to be understood that the electrode can be those used to establish both a capacitively coupled reactor and an inductively coupled reactor.

When a substrate is being etched in a plasma, the potential of the front surface 56 (FIG. 2) of the wafer assumes a time averaged negative potential with respect to the plasma potential. The time averaged negative potential or DC potential (commonly referred to as the "DC Bias", $V_{dc}$) is generally dependent on the plasma conditions and the low and high frequency power applied to the wafer. In this particular situation, due to the presence of the high dielectric constant and/or ferroelectric material layer on the substrate, the back surface 58 of the wafer 26 is insulated from the front surface 56 of the wafer. The DC potential of the back surface 58 of the wafer is determined primarily by the clamping voltage from the chuck 48. For example, in the case of using an electrostatic clamp, the DC potential of the back side 58 of the wafer is greatly influenced by the clamping voltage ($V_{ESC}$). By way of example only, in a representative etch process, $V_{dc}$ can be for example −1000 volts, and $V_{ESC}$ can be for example −700 volts. The difference would then be (−1000 volts)−(−700 volts), or −300 volts. The less negative the difference is the less likely that arcing will occur. In other words, the lower the absolute value of $V_{dc}-V_{ESC}$ is the less likely that arcing will occur. It is to be understood that arcing can occur at a potential of −200 volts or smaller negative potential values, but that it generally occurs at a potential of −300 volts and certainly at greater negative potential values.

For a system with a pure mechanical clamp, the potential of the back surface of the wafer is not generally well controlled and assumes a value somewhere between zero and the potential of the front surface of the wafer. Thus, due to the presence of the high dielectric constant and/or ferroelectric layer between the front and the back surface of the wafer, a potential difference between the two surfaces can exist. The potential difference between the front and the back surfaces of the wafer (across the high dielectric constant and/or ferroelectric layer) can be high (several hundred volts), especially when high dielectric constant materials such as strontium bismuth tantalate (Y−1) are being used.

Another high dielectric constant film material that can benefit from the invention include lead zirconium titanate (PZT).

The DC potential difference between the front and the back surface of the wafer can lead to very high electric fields, especially across thinner dielectric layers or material defects. The value of this electric field can far exceed the breakdown strength of the dielectric leading to an electrical breakdown.

It has been found that Y1 films can have material defects caused during the Y1 film formation, which defects consists of "cracks" in the dielectric layer, where the dielectric layer is very thin. Electrical breakdown of the dielectric can occur in the "crack" area leading to an arc on the front side of the wafer.

When the ESC potential, $V_{ESC}$, is set to a value which is close to the potential of the front surface of the wafer, the potential difference and hence the electric field in the dielectric layer and/or ferroelectric layer are substantially reduced. This prevents and/or substantially decreases the number and physical size of the arc spots on the wafer being etched.

Accordingly, the electrostatic clamp voltage is adjusted to eliminate and/or substantially reduce arcing or dielectric breakdown which may occur when a substrate containing a layer of, by way of example only, a high dielectric constant and/or ferroelectric material, is being etched in a plasma.

The invention thus makes use of the electrostatic clamp for a novel application of eliminating and/or substantially reducing arcing or dielectric breakdown which may occur when a substrate containing a layer of high dielectric constant and/or ferroelectric material is being etched in a plasma. Although electrostatic clamps are widely used in practice for clamping substrates without the need for any front side contact, the electrostatic clamp potential has never been used as a "knob" to control the occurrence of arcing and/or dielectric breakdown.

Figure 3:
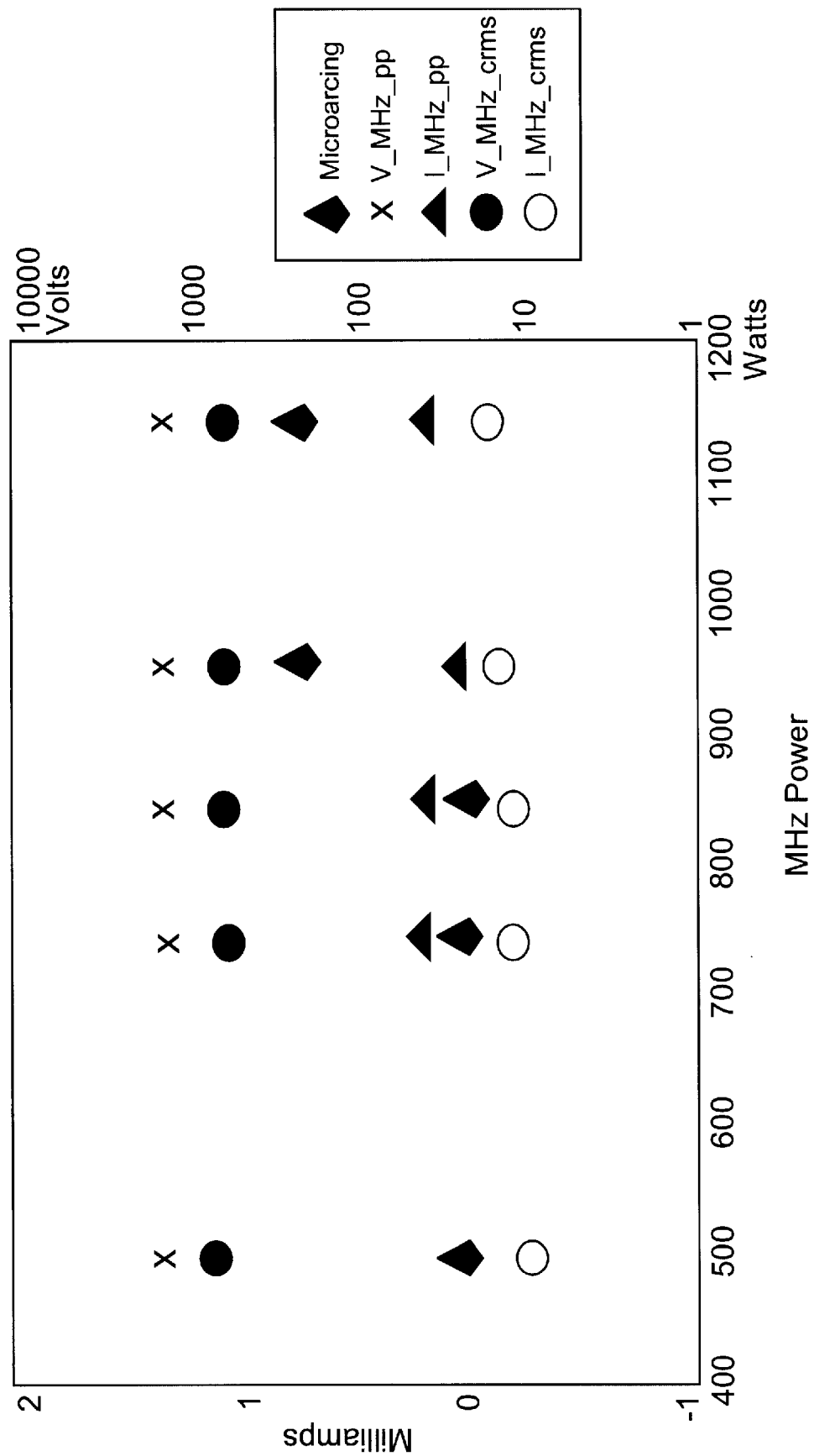
FIG. 3 depicts a chart showing the controller step function of an embodiment of the invention.

FIG. 3 demonstrates a dramatic step function jump from essentially little or no arcing or microarcing below about 900 watts from the MHz power supply 36 to damaging arcing at above about 900 watts. Accordingly, arcing increases with the increase in the MHz power and with an increase in $V_{dc}-V_{ESC}$. Further, increasing the KHz power can also provide an onset of arcing. Accordingly, the invention includes programming the control 40 to ensure that the $V_{ESC}$ is appropriately set in order to dynamically keep the difference $V_{dc}-V_{ESC}$ during an etch operation in a desirable range, and below a arcing threshold value, no matter what the operating condition for power supply 34 and 36 are. Thus, as the power supplies are ramped and cycled, the control 40 can keep $V_{ESC}$ and the difference $V_{dc}-V_{ESC}$ below an appropriate threshold to minimize or prevent arcing.

Industrial Applicability

Accordingly, the present invention is useful in successfully etching emerging films such as high dielectric constant and ferroelectric films. It can be seen that the present invention allows for improved throughput by minimizing or eliminating arcing which can destroy some or all of the wafer.

Other features, aspects and objects of the invention can be obtained from a review of the figures and the claims.

It is to be understood that other embodiments of the invention can be developed and fall within the spirit and scope of the invention and claims.

We claim:

1. A method for reducing arcing across a workpiece in a plasma reactor including the steps of:
   placing a workpiece into a reactor onto a monopolar chuck with a single electrostatic clamp electrode, the workpiece having a first side facing away from the monopolar chuck and a second side facing the monopolar chuck;
   generating a plasma in the reactor, the plasma contacting the first side of the workpiece; and
   controlling a voltage potential between the first side and second side of the workpiece by controlling a voltage applied to the single electrostatic clamp electrode of the chuck in order to minimize arcing between the first side and the second side of the workpiece.

2. The method of claim 1 wherein:
   said controlling step occurs prior to the step of generating a plasma.

3. The method of claim 1 wherein:
   said controlling step occurs at anytime when there is a plasma in the reactor.

4. The method of claim 1 including the steps of:
   creating a voltage, $V_{dc}$, at the first side of the workpiece in contact with the plasma;
   creating a voltage, $V_{ESC}$, at the second side of the workpiece in contact with the chuck; and
   the controlling step includes controlling the difference between $V_{dc}$ and $V_{ESC}$ in order to minimize arcing.

5. The method of claim 4 wherein:
   the controlling step includes minimizing the difference between $V_{dc}$ and $V_{ESC}$.

6. A method for reducing arcing across a semiconductor wafer in a plasma reactor including the steps of:
   placing a semiconductor wafer into a reactor onto a monopolar electrostatic chuck with a single electrostatic clamp electrode;
   generating a plasma in the reactor; and
   controlling a voltage applied by the single electrostatic clamp electrode of the electrostatic chuck to the wafer in order to minimize arcing between a first surface of the workpiece in contact with the plasma and a second surface of the workpiece in contact with the monopolar chuck.

7. The method of claim 6 wherein:
   said controlling step occurs prior to the step of generating a plasma.

8. The method of claim 6 wherein:
   said controlling step occurs at anytime when there is a plasma in the reactor.

9. The method of claim 6 including the steps of:
   creating a voltage, $V_{dc}$, at a first surface of the wafer in contact with the plasma;
   the controlling step includes creating a voltage, $V_{ESC}$, at a lower surface of the wafer in contact with the chuck; and
   the controlling step further includes controlling the difference between $V_{dc}$ and $V_{ESC}$ in order to minimize arcing between the first surface and the second surface.

10. The method of claim 9 wherein:
    the controlling step includes minimizing the difference between $V_{dc}$ and $V_{ESC}$.

11. The method of claim 1 wherein:
    the step of generating a plasma includes applying one of a high frequency power supply and a low frequency power supply to the chuck.

12. The method of claim 1 wherein:
    the step of generating a plasma includes applying both a high frequency power supply and a low frequency power supply to the chuck.

13. The method of claim 6 wherein:
    the step of generating a plasma includes applying one of a high frequency power supply and a low frequency power supply to the chuck.

14. The method of claim 6 wherein:
    the step of generating a plasma includes applying both a high frequency power supply and a low frequency power supply to the chuck.

15. The method of claim 1 wherein:
    said controlling step occurs during at least one of prior to a step of etching a workpiece, and during a step of etching a workpiece.

16. The method of claim 6 wherein;
    said controlling step occurs during at least one of prior to a step of etching a wafer, and during a step of etching a wafer.

17. The method of claim 1 wherein:
    said workpiece includes a layer of a high dielectric constant material.

18. The method of claim 1 wherein:
    said workpiece includes a layer of a ferroelectric material.

19. The method of claim 6 wherein:
    said wafer includes a layer of a high dielectric constant material.

20. The method of claim 6 wherein:
    said wafer includes a layer of a ferroelectric material.

21. The method of claim 1 including:
    said generating step including (a) generating a plasma in a tri-electrode reactor with an upper and a lower electrode and a side electrode, and wherein said lower electrode is associated with the chuck, and (b) applying at least one of a high frequency power supply and a low frequency power supply to the lower electrode.

22. The method of claim 21 wherein:
    said generating step includes applying both a high frequency power supply and a low frequency power supply to the lower electrode.

23. The method of claim 21 including the steps of:
    grounding the upper electrode, and either grounding the side electrode, or allowing the side electrode to establish a floating potential.

24. The method of claim 6 including:
    said generating step including (a) generating a plasma in a tri-electrode reactor with an upper and a lower electrode and a side electrode, and wherein said lower electrode is associated with the chuck, and (b) applying at least one of a high frequency power supply and a low frequency power supply to the lower electrode.

25. The method of claim 24 wherein:
    said generating step includes applying both a high frequency power supply and a low frequency power supply to the lower electrode.

26. The method of claim 25 including the steps of:
    grounding the upper electrode, and either grounding the side electrode, or allowing the side electrode to establish a floating potential.

* * * * *